United States Patent
Hudson et al.

(10) Patent No.: US 6,940,416 B2
(45) Date of Patent: Sep. 6, 2005

(54) LOW VOLTAGE TESTING AND ILLUMINATING DEVICE

(75) Inventors: James Hudson, Wauconda, IL (US); Thomas J. Mayer, Wauconda, IL (US)

(73) Assignee: Varon Lighting, Inc., Elmhurst, IL (US)

( * ) Notice: Subject to any disclaimer, the term of this patent is extended or adjusted under 35 U.S.C. 154(b) by 137 days.

(21) Appl. No.: 10/208,683

(22) Filed: Jul. 30, 2002

(65) Prior Publication Data

US 2004/0021578 A1 Feb. 5, 2004

(51) Int. Cl.⁷ .............................................. G08B 21/00
(52) U.S. Cl. ...................... 340/663; 340/635; 340/660; 324/556; 324/133; 324/428
(58) Field of Search .................... 340/660, 661, 340/662, 663, 636.15, 657, 635; 307/10.1; 324/555, 556, 133, 537, 99 D, 551, 433, 428, 678; 361/78, 113, 79, 187

(56) References Cited

U.S. PATENT DOCUMENTS

| | | | |
|---|---|---|---|
| 3,927,399 A | * 12/1975 | Fuzzell | ........................ 340/514 |
| 4,027,227 A | 5/1977 | Engel | |
| 4,028,057 A | 6/1977 | Nelson | |
| 4,056,765 A | * 11/1977 | Scheidler et al. | .............. 322/99 |
| 4,470,039 A | 9/1984 | McBrian | |
| 4,647,831 A | 3/1987 | O'Malley | |
| 4,898,229 A | 2/1990 | Brown | |
| 4,983,955 A | * 1/1991 | Ham et al. | ................... 340/664 |
| 5,063,491 A | * 11/1991 | Shigeo | ..................... 363/56.11 |
| 5,309,084 A | 5/1994 | Jiang | |
| 5,495,147 A | 2/1996 | Lanzisera | |
| 6,075,448 A | 6/2000 | Verkhovskiy | |
| 6,153,980 A | 11/2000 | Marshall | |

* cited by examiner

*Primary Examiner*—Anh V. La
(74) *Attorney, Agent, or Firm*—Leon I. Edelson; William C. Clarke; Levenfeld Pearlstein

(57) ABSTRACT

This invention relates to a limited range low voltage testing, regulating, and indicating device comprising a detector and low voltage measurer of magnitude in a switch-regulated power supply circuit wherein indicator LEDs are operated directly from a power supply wherein continually increasing current draw provided by shunt switching operates to cause the first display LEDs to "fade" in an overlapping pattern of activation, in and out with slight voltage changes. Increased voltage causes a second LED to turn on. Further increased voltage causes the second LED to turn off and a third LED to turn on. Shunt and series connected voltage regulators selectively exert control over the LEDs.

3 Claims, 2 Drawing Sheets

| | |
|---|---|
| D1 - D4 | 1N4002 |
| C1 | 1000 mF @ 1.6 VDC |
| Q1 | G/P NPN 30 V 1 AMP |
| Q2 - Q4 - Q5 | 2N3904 |
| Q3 | 2N3906 |
| R1, R2, R3, R4, R6, R8 | 1k 1/4 W 5% |
| R5 | 47 1/2 W 5% |
| R7 | 100 1/4 W 5% |
| Z1 | 1N5243 (13 V 500 mW) |
| Z2 | 1N5244 (14 V 500 mW) |
| Z3 | 1N5246 (16 V 500mW) |
| LED #1 & LED #3 | CMD3750 (RED) |
| LED #2 | CMD3450 (GREEN) |

LOW VOLTAGE TESTING AND ILLUMINATING DEVICE

FIELD OF THE INVENTION

The instant invention relates to a limited range low voltage testing, regulating, and indicating device comprising a detector and low voltage measurer of magnitude in a switch-regulated power supply circuit wherein indicator LEDs are operated directly from a power supply wherein the continually increasing current draw provided by shunt switching operates to cause the display LEDs to "fade," in an overlapping pattern of activation, in and out with slight voltage changes. With higher applied voltage to the input pin, the low voltage tester draws more current, thus little energy is required to cause an LED to illuminate at a lower voltage and to "fade" out at a higher voltage regulated by a transistor shunt switch. Increased voltage causes a second LED to turn on. Further the increased voltage causes the second LED to turn off by a transistor shunt switch, and to turn on a third LED regulated by a series pass voltage regulation circuit. The instant invention accordingly relates to regulated power supplies wherein a low voltage high current power supply with low output ripple is required as in computer applications and transistorized equipment. In the prior art, when it was desired to turn LEDs on and off, a transistor switching element is connected in series with such devices and control voltage is applied or removed from the base/emitter of the switching element.

An object of this invention is to provide a detector of low voltage DC by visual indication of the magnitude of the low voltage by causing an LED to illuminate at a lower voltage and to "fade" out at a higher voltage.

A second object is to provide visual indication of the magnitude of the low voltage by causing an LED to illuminate at a lower voltage and to "fade" out at a higher voltage at a savings in cost and space over conventional means.

A third object is to provide a shunt-type LED voltage control over a conventional volt meter, as the shunt type LED voltage control means is not subject to mechanical shocks and is self-actuating to provide a constant indication of the voltage level.

A fourth object is to provide a series pass voltage regulator to protect the circuit from possible over voltage conditions.

BACKGROUND OF THE INVENTION

In the prior art, electronic switches use LEDs to indicate by illumination the on and off of operating voltage to electrical equipment to indicate start and shut down functions of motors and electrical appliances. Both series and shunt regulators are used to control on/off operation of LEDs in the prior art.

Verkhovskiy, U.S. Pat. No. 6,075,448, teaches and claims a test value apparatus capable of differentiating between a shunt circuit and a low resistance value. A light emitting diode (LED) provides indications of the voltage values, the LED being so connected to enable variation of light by the LED in a manner inversely indicating resistance values across the circuit. The test apparatus comprises a shunting resistor for creating a shunt around the LED and a shunting switch for momentarily connecting the shunt so the LED provides an indication of the presence of a short in the circuit.

Jiang, U.S. Pat. No. 5,309,084 teaches and claims an electronic switch with on/off fading comprising a bridge rectifier and a thyrister. A triggering branch has a trigger pulse including a series connection branch of a voltage regulator diode and capacitor or LED. The nonlinear characteristics of the voltage regulator diode or LED inactivate a synchronic integrator circuit in an "on" stationary state, thereby reducing the forward bias of the diode in the trigger pulse integrator and reducing the angle of triggering. The triggering of the thyrister initiates the fading on process. As the trigger angle increases, the thyrister is cut off in the fading off process.

Nelson, U.S. Pat. No. 4,028,057 teaches and claims a plurality of light emitting diodes (LEDs) arranged to form an analog display in proportion to the gas present as read by a gas analyzer. Each LED is shunted by an electronic switch to ground having a control element whereby each LED is turned off when the catalytic and resistance elements of the gas analyzer warm up and generate an output which turns on an LED in the analog display. The electronic switch is in the form of an n-p-n transistor between the hot side of an additional LED and ground.

Marshall, U.S. Pat. No. 6,153,980, teaches and claims an LED array having plurality of LEDs connected in series with at least one active shunt connected in parallel across one or more of the LEDs and digital control logic for detecting an open circuit and activating active shunts to restore a closed circuit condition. Each of the active shunts is an active switching device, such as a power MOSFET or a bipolar transistor connected in parallel across each LED.

Lanzisera, U.S. Pat. No. 5,495,147, teaches and claims an LED light system comprising a plurality of LEDs connected in parallel and a regulated power supply providing a constant current and a constant voltage from an AC line input, a rectifier for rectifying the voltage, and a voltage regulator to provide a constant voltage and constant current wherein a zener diode limits the voltage fed into the voltage regulator.

Brown, U.S. Pat. No. 4,898,229, teaches and claims a low voltage thermostat for controlling operation of a heating and cooling system with a voltage regulator in series with an LED for detecting an over-voltage whereby an over-voltage causes the voltage regulator comprising a zener diode to break over and the LED to illuminate and indicate the over-voltage.

O'Malley, U.S. Pat. No. 4,647,831, discloses a rechargeable battery-operated appliance system wherein a switch provides a shunt around an LED which illuminates when the device is placed in a charging stand.

McBrian, U.S. Pat. No. 4,470,039 discloses an alarm shunt arrangement which provides an LED indicator light to indicate an alarm condition when the shunt switch is activated.

Engel, U.S. Pat. No. 4,027,227, discloses a combination series and shunt voltage regulating system which comprises a sensor for controlling a series regulator of transistors. The shunt regulator comprises a zener diode.

Accordingly, Verkhovskiy '448 discloses a shunting resistor and a shunting switch; Jiang '084, an electronic switch with on/off fading; Nelson '057, a plurality of LEDs and n-p-n transistor electronic switch; Marshall '980, a plurality of shunts in parallel across respective LEDs; Lanzisera '147, a zener diode and voltage regulator provide constant voltage and constant current; Brown '229, LED illumination when over-voltage causes a zener diode to break over; O'Malley '831, a shunt around an LED which illuminates during operation of a device; McBrian '039, an LED indicates an alarm condition when a shunt arrangement is activated; and Engel '227, a combination shunt and series voltage regulating system comprising a zener diode shunt regulator and a series regulator of transistors.

Accordingly, in the prior art it is well-known to utilize electronic switches with LED on/off fading, and shunt and switch regulators to turn LEDs on and off. However, a limited range low voltage testing and indicating device comprising a detector and low voltage regulator and measurer of magnitude in a switch-regulated power supply circuit wherein indicator LEDs operate to indicate separately the presence of voltage, a higher voltage, and an over-voltage has not been taught in the prior art.

SUMMARY OF THE INVENTION

This invention relates to a novel limited range low voltage testing, regulating, and indicating device comprising a detector and measurer of low voltage magnitude wherein light emitting diodes (LEDs) separately illuminate to indicate the presence of a minimum voltage, a higher voltage, and an over-voltage. The LEDs are operated directly from the power supply. The first LED is turned off by a shunt transistor switch. The second LED is turned on by an increased voltage and turned off by a shunt transistor switch. The third LED is turned on by increased over-voltage to indicate potential damage to the LEDs may result. A series pass voltage regulator protects the circuit from possible over voltage variations and supplies a constant output voltage despite changes in alternating voltage input of the power supply.

DETAILS OF THE INVENTION

Figure 1:
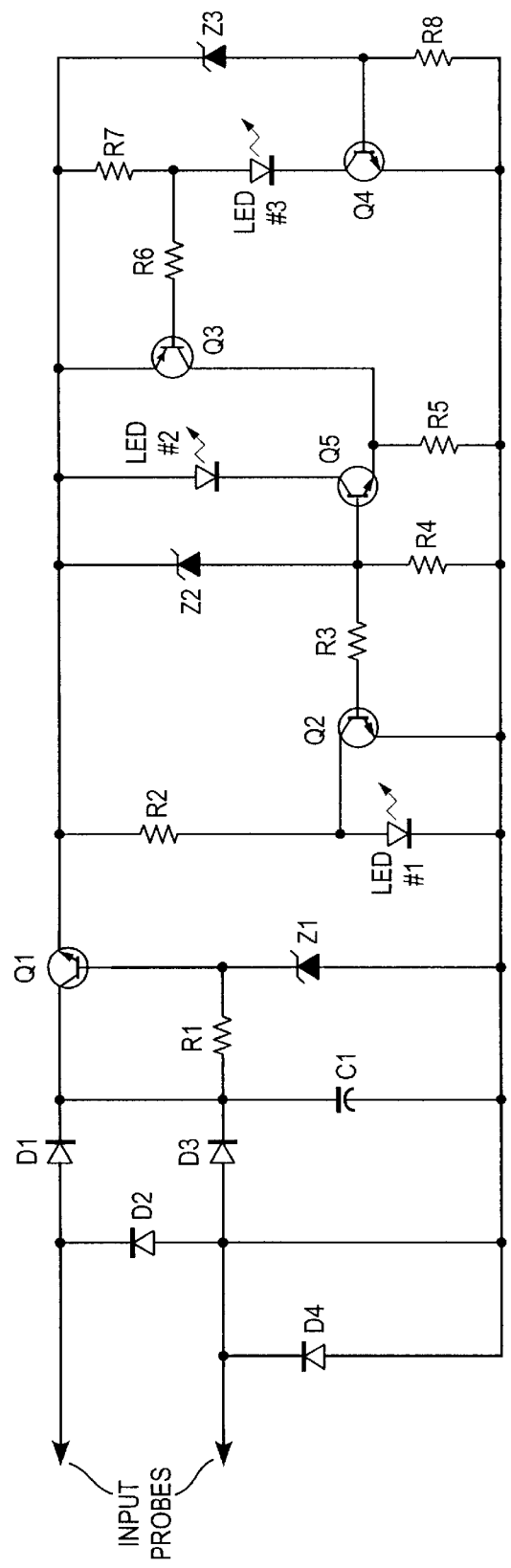
FIG. 1 is a schematic diagram of the low voltage testing, regulating, and indicating device of the invention.
Figure 2:
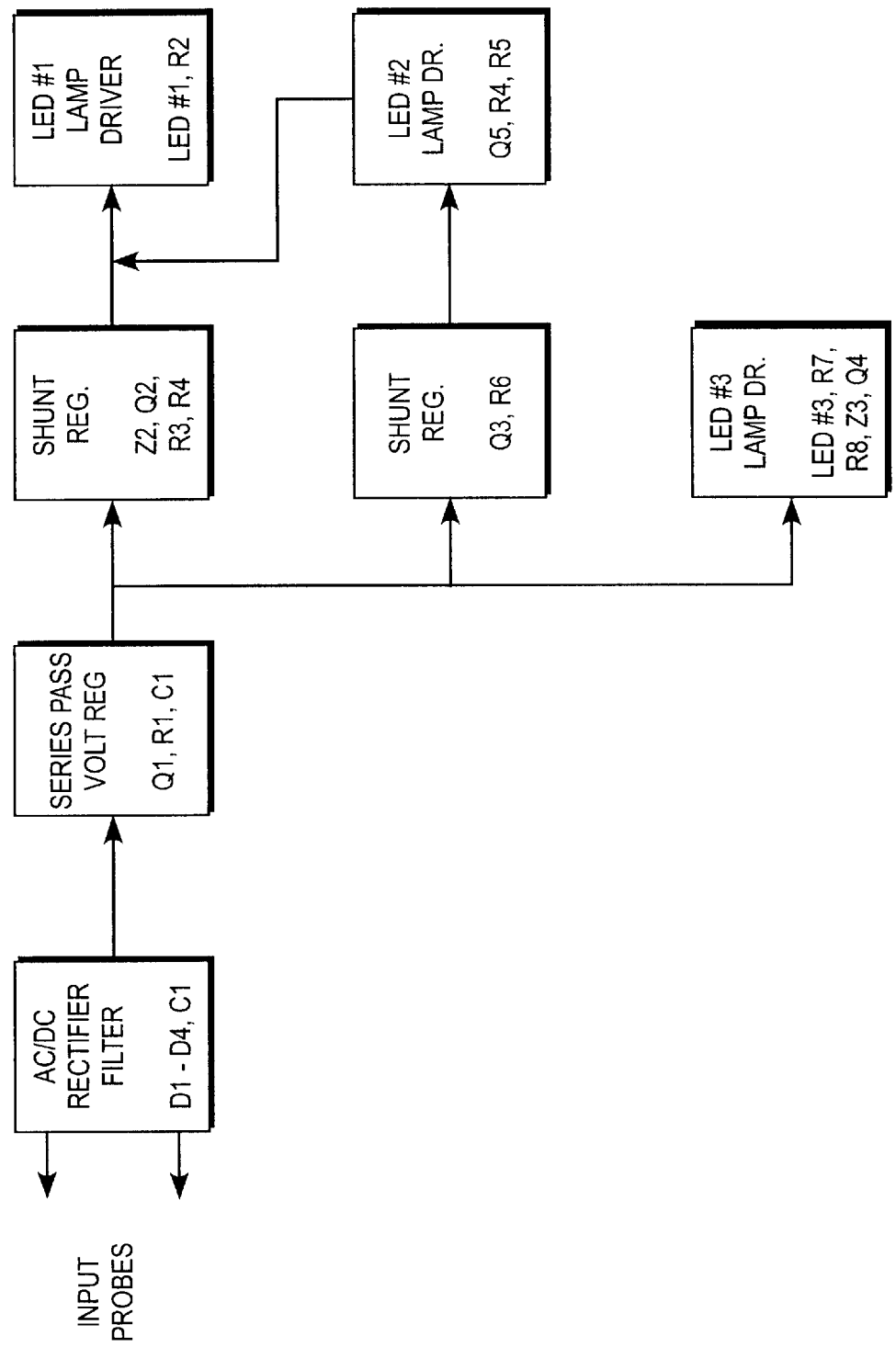
FIG. 2 is a simplified block diagram of the low voltage testing, regulating, and indicating device of the invention.

In the prior art, when it is required to turn an LED on or off, a transistor switching element typically is connected in series with the LED and control voltage is applied or removed from the base or emitter of its switching element. In the instant invention, the LEDs are operated directly from the power supply, a series pass voltage regulator controlling the DC voltage up to 30 watts DC from the power supply impressed across the load encompassing the LED circuitry. Available AC voltage from the power supply accordingly is detected and measured at the input test probes. Alternating current from the power source is rectified as obtained at the probes by a full wave rectifier using a bridge network of four diodes to charge an input filter capacitor to the peak DC voltage of the rectified DC output of the power source. Referring to FIG. 1, the four diodes are D1, D2, D3 and D4. The input filter capacitor is C1. As AC voltage increases across the input test probes, the DC voltage increases from the full wave rectifier diodes and the input filter capacitor and nears the threshold voltage of zener diode Z1 as limited by resister R1 to control the collector-emitter resistance of transistor Q1, and cause Q1 to begin to conduct. As the voltage increases, Z1 begins to draw current which raises the voltage at the base of Z1 to cause Z1 to conduct to supply power to resister R2 and LED1 to cause LED1 to illuminate. As Q1 conducts, resister R2 continuously supplies power to LED1 with no series control element used. As AC voltage across the input probes increases, the DC voltage nears the threshold voltage of zener diode Z2, as limited by resister R4, and Z2 begins to conduct current to apply an increasing voltage at the bases of transistor Q2 and transistor Q5 The increased voltage to the base of Q2, as limited by resister R3, biases on Q2, now considered a shunt switch. Q2 clamps across LED1, starving LED1 of voltage and turning off LED1. However, energy does continue to flow through resister R2 in series with LED1 and at levels higher than those seen while LED1 was active.

As input AC voltage continues to increase, circuit DC voltage continues to increase and zener diode Z2 begins to conduct to bias the base of transistor Q5, to cause Q2 to conduct as a series voltage regulator, to cause LED2 to illuminate. As the input voltage continues to increase, the increasing voltage eventually nears the threshold voltage of zener diode Z3 which begins to conduct. An increasing voltage is applied to the base of transistor Q4 causing partial conduction as voltage across R6 increases. As voltage across R8 increases, the base of transistor Q4 is pulled further off ground, causing partial conduction in Q4 and the voltage across LED3 increases, causing it to "partially" light to glow dimly. The voltage at the base of transistor Q3, via current limiting resistor R6 causes the collector voltage of Q3 to increase, Q5 becoming a shunt switch across transistor Q5 and the LEDs, extinguishing LED2 and drawing even higher current through resistor R5. As LED2 is extinguished, the voltage continues to rise and LED3 is fully illuminated. This results in a "high" voltage indication where potential damage to the elements of the circuit may result.

As above described, the higher the applied AC voltage at the input probes, the more current the low voltage tester circuit draws. This continually increasing current draw provided by the shunt switching plays an important role in allowing the display LEDs to "fade" in and out with slight voltage changes. This "fade" or overlap of the switching of the LED's display allows the low voltage tester to act as a limited range voltage measuring device rather than a full range volt meter or a "go-no-go" tester.

While it is understood the present invention has been described in terms of the presently preferred embodiments, it is to be understood such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the scope of such disclosure.

In summary, the instant invention comprises a limited range low voltage testing and indicating device for detecting, regulating, measuring and indicating increasing and decreasing available DC voltage from a DC power source of up to 30 watts DC comprising individual detecting, measuring, regulating, and power providing means wherein a load circuit of light emitting diodes (LEDs) are separately turned on, illuminated, and turned off to indicate the presence and non-presence of a regulated range of DC voltage from said DC power source from an unregulated AC power source wherein said means comprises multiple shunt and series connected voltage regulators in series with light emitting diodes between said DC power source and said LEDs and wherein said multiple shunt and series connected voltage regulators selectively exert control over distinct portions of the said load circuit of said LEDs and wherein said multiple shunt and series connected voltage regulators comprise individual zener diodes.

Also, the instant invention comprises a combination regulating device comprising a source of unregulated AC, a full wave rectifier using a bridge network of four transistor diodes to charge an input filter capacitor to unregulated peak DC voltage, a series pass voltage regulator to regulate said unregulated DC voltage, a first regulating means coupled to said source and a load circuit of a first light emitting diode (LED) to detect, measure and indicate presence of a first range of DC voltage, a second regulating means coupled to said source and first regulating means and load circuit of said first LED and load circuit of a second LED to regulate power to said first LED and to second LED, and a third regulating means coupled to said source and load circuit of said second LED to regulate power to said second LED and to third LED wherein first and second regulating means comprise shunt connected voltage regulators and the third regulating means comprises a series connected voltage regulator and wherein said shunt connected voltage regulators and said series connected voltage regulator separately comprise individual zener diodes.

Also, the invention comprises, in combination, a source of regulated potential, a load circuit, a first voltage dropping resistor and first regulating means connected between said source and regulating means, a second voltage dropping resistor and a second regulating means, connected between said source and said second regulating means, and a third dropping resistor and a third regulating means connected between said source and third regulating means, each regulating means comprising a selected individual zener diode for supplying a control potential for controlling said first, second, and third regulating means, each said selected individual zener diode shunt connected in said first and said second regulating means and said selected individual zener diode series connected in said third regulating means.

What is claimed is:

1. A combination regulating device comprising a source of unregulated AC, a full wave rectifier using a bridge network of four transistor diodes to charge an input filter capacitor to unregulated peak DC voltage, a series pass voltage regulator to regulate said unregulated DC voltage, a first regulating means coupled to said source and a load circuit of a first light emitting diode (LED) to detect, measure and indicate presence of a first range of DC voltage, a second regulating means coupled to said source and first regulating means and load circuit of said first LED and load circuit of a second LED to regulate power to said first LED and to second LED, and a third regulating means coupled to said source and load circuit of said second LED to regulate power to said second LED and to third LED.

2. The combination regulating device of claim 1 wherein: first and second regulating means comprise shunt connected voltage regulators and the third regulating means comprises a series connected voltage regulator.

3. The combination regulating device of claim 2 wherein said shunt connected voltage regulators and said series connected voltage regulator separately comprise individual zener diodes.

* * * * *